(12) United States Patent
Min et al.

(10) Patent No.: US 8,617,998 B2
(45) Date of Patent: Dec. 31, 2013

(54) METHOD OF FORMING A MICRO-PATTERN FOR SEMICONDUCTOR DEVICES

(75) Inventors: Jae-ho Min, Yongin (KR); Seong-soo Lee, Seongnam-si (KR); Ki-jeong Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 13/170,620

(22) Filed: Jun. 28, 2011

(65) Prior Publication Data

US 2011/0318931 A1      Dec. 29, 2011

(30) Foreign Application Priority Data

Jun. 29, 2010   (KR) .................. 10-2010-0062078

(51) Int. Cl.
*H01L 21/302*   (2006.01)

(52) U.S. Cl.
USPC ........... 438/717; 438/720; 438/724; 438/742; 438/744

(58) Field of Classification Search
USPC ....................... 438/717, 720, 724, 742, 744
See application file for complete search history.

(56) References Cited

U.S. PATENT DOCUMENTS

| 2009/0117739 A1* | 5/2009 | Shin et al. ............. 438/690 |
| 2009/0154240 A1* | 6/2009 | Park et al. ............ 365/185.05 |

FOREIGN PATENT DOCUMENTS

| JP | 2007-305970 | 11/2007 |
| KR | 100874433 B1 | 12/2008 |
| KR | 1020090042458 A | 4/2009 |

* cited by examiner

*Primary Examiner* — Binh X Tran
(74) *Attorney, Agent, or Firm* — Myers Bigel Sibley & Sajovec, P.A.

(57) ABSTRACT

Methods of forming integrated circuit devices utilize fine width patterning techniques to define conductive or insulating patterns having relatively narrow and relative wide lateral dimensions. A target material layer is formed on a substrate and first and second mask layers of different material are formed in sequence on the target material layer. The second mask layer is selectively etched to define a first pattern therein. Sidewall spacers are formed on opposing sidewalls of the first pattern. The first pattern and sidewall spacers are used collectively as an etching mask during a step to selectively etch the first mask layer to define a second pattern therein. The first pattern is removed to define an opening between the sidewall spacers. The first mask layer is selectively re-etched to convert the second pattern into at least a third pattern, using the sidewall spacers as an etching mask. The target material layer is selectively etched using the third pattern as an etching mask.

22 Claims, 15 Drawing Sheets

METHOD OF FORMING A MICRO-PATTERN FOR SEMICONDUCTOR DEVICES

REFERENCE TO PRIORITY APPLICATION

This application claims the benefit of Korean Patent Application No. 10-2010-0062078, filed on Jun. 29, 2010, in the Korean Intellectual Property Office, the disclosure of which is hereby incorporated herein in its entirety by reference.

BACKGROUND

The inventive concept relates to a method of forming semiconductor devices, and more particularly, to a method of forming a micro-pattern for semiconductor devices.

A double patterning method has been proposed to overcome the resolution limit of a photolithography process. However, there is room for improvement in applying the double patterning method.

SUMMARY OF THE INVENTION

Methods of forming integrated circuit devices according to embodiments of the invention utilize fine width patterning techniques to define conductive or insulating patterns having relatively narrow and relative wide lateral dimensions. According to some of these embodiments of the invention, a target material layer is formed on a substrate and first and second mask layers of different material are formed in sequence on the target material layer. The second mask layer is selectively etched to define a first pattern therein. Sidewall spacers are formed on opposing sidewalls of the first pattern. The first pattern and sidewall spacers are then used collectively as an etching mask during a step to selectively etch the first mask layer to define a second pattern therein. The first pattern is then removed to define an opening between the sidewall spacers. The first mask layer is then selectively re-etched to convert the second pattern into at least a third pattern, using the sidewall spacers as an etching mask. Thereafter, the target material layer is selectively etched using the third pattern as an etching mask.

According to some additional embodiments of the invention, the step of forming sidewall spacers may include depositing a silicon oxide layer on the first pattern using an atomic layer deposition (ALD) or chemical vapor deposition (CVD) technique and then etching back the deposited silicon oxide layer to define the sidewall spacers. The step of forming a target material layer may also include depositing an electrically conductive layer on the substrate. This electrically conductive layer may be formed of a material selected from a group consisting of metals, metal nitrides, metal silicides and doped or undoped polysilicon. Alternatively, the target material layer may be an electrically insulating layer. In addition, the first mask layer may be a silicon nitride layer having a thickness in a range from about 500 angstroms to about 3000 angstroms and the second mask layer may be an organic material layer having a thickness in a range from about 1000 angstroms to about 5000 angstroms.

Additional embodiments of the invention include methods of forming integrated circuit memory devices. According to some of these embodiments of the invention, an electrically conductive target material layer is formed on a substrate and first and second mask layers of different material are formed on the target material layer. The second mask layer is selectively etched to define a first pattern therein and then sidewall spacers are formed on opposing sidewalls of the first pattern. This first pattern and the sidewall spacers are then used collectively as an etching masked during a step of selectively etching the first mask layer to define a second pattern therein. Then, the first pattern is removed to thereby define an opening between the sidewall spacers. A first portion of the second pattern is then covered with a protective third mask layer prior to a step of selectively re-etching the first mask layer to convert a second portion of the second pattern into at least a third pattern, using the sidewall spacers (and third mask layer) as an etching mask. This third pattern is then covered with a protective fourth mask layer before selectively etching the first portion of the second pattern to thereby define a fourth pattern. Thereafter, the target material layer is selectively etched using the third pattern as an etching mask to define a plurality of word lines of the memory device and also using the fourth pattern as an etching mask to define a plurality of contact pads that are electrically connected to the plurality of word lines.

BRIEF DESCRIPTION OF THE DRAWINGS

Exemplary embodiments of the inventive concept will be more clearly understood from the following detailed description taken in conjunction with the accompanying drawings in which:

FIGS. 4A-14A and 4B-14B are plan views and cross-sectional views, respectively, illustrating a process sequence of a method of forming a micro-pattern for semiconductor devices, according to an embodiment of the inventive concept.

DETAILED DESCRIPTION OF THE EMBODIMENTS

Figure 1:
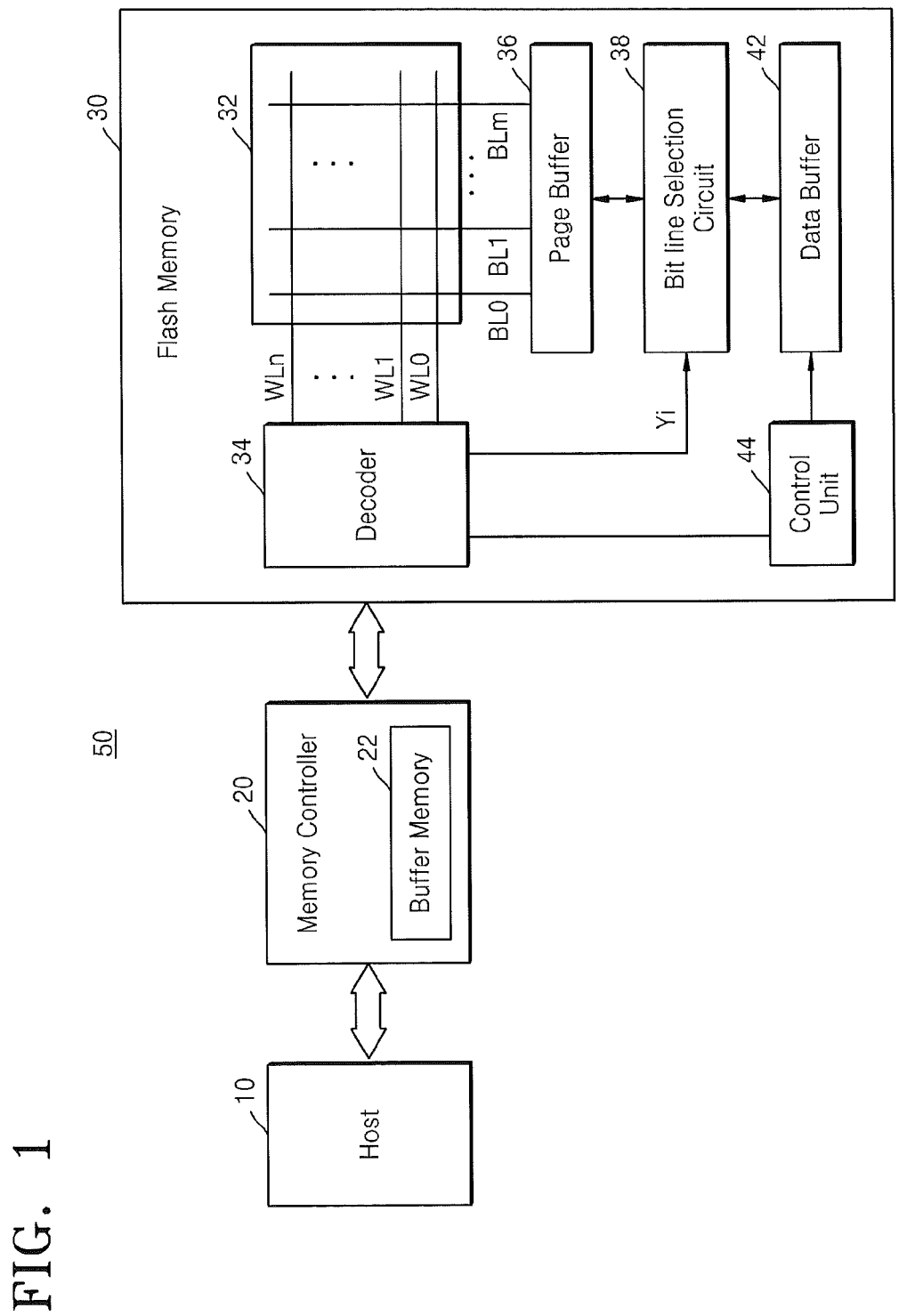
FIG. 1 is a schematic block diagram showing a memory system of a semiconductor device formed using a method of forming a micro-pattern, according to an embodiment of the inventive concept.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. Like reference numerals in the drawings denote like elements. In the drawings, various elements and regions are schematically drawn. Therefore, the inventive concept is not limited to the relative sizes and gaps depicted in the accompanying drawings.

It will be understood that, although the terms first, second, third, etc., may be used herein to describe various elements, these elements should not be limited by these terms. These terms are only used to distinguish one element from another. Thus, a first element could be termed a second element and a second element could be termed a first element without departing from the teachings of the present inventive concept.

The terminology used herein is for the purpose of describing particular embodiments only and is not intended to be limiting of the inventive concept. As used herein, the singular forms are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, and/or components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used in dictionaries, should be interpreted as having a meaning that is consistent with their meaning in the context of the relevant art and will not be interpreted in an idealized or overly formal senses unless expressly so defined herein.

FIG. 1 is a schematic block diagram showing a memory system 50 of a semiconductor device that can be formed using a method of forming a micro-pattern, according to an embodiment of the inventive concept. Referring to FIG. 1, the memory system 50 of a semiconductor device may include a host 10, a memory controller 20, and a flash memory 30. The memory controller 20 performs as an interface between the host 10 and the flash memory 30, and may include a buffer memory 22. Although not shown, the memory controller 20 may further include a central processing unit (CPU), a read-only memory (ROM), a random-access memory (RAM), and interface blocks. The flash memory 30 may further include a cell array 32, a decoder 34, a page buffer 36, a bit line selection circuit 38, a data buffer 42, and a control unit 44. Data and a write command are input to the memory controller 20 from the host 10, and the memory controller 20 controls the flash memory 30 to write the data in the cell array 32 in response to the input write command. Also, the memory controller 20 controls the flash memory 30 to read data stored in the cell array 32 in response to a read command input from the host 10. The buffer memory 22 temporarily stores data transmitted between the host 10 and the flash memory 30. The cell array 32 of the flash memory 30 includes a plurality of memory cells. The decoder 34 is connected to the cell array 32 through word lines $WL_0, WL_1, \ldots WL_n$. The decoder 34 generates a selection signal Yi in response to an address input from the memory controller 20 to select one of the word lines $WL_0, WL_1, \ldots WL_n$ or bit lines $BL_0, BL_1, \ldots BL_n$. The page buffer 36 is connected to the cell array 32 through the bit lines $BL_0, BL_1, \ldots BL_m$.

Figure 2:
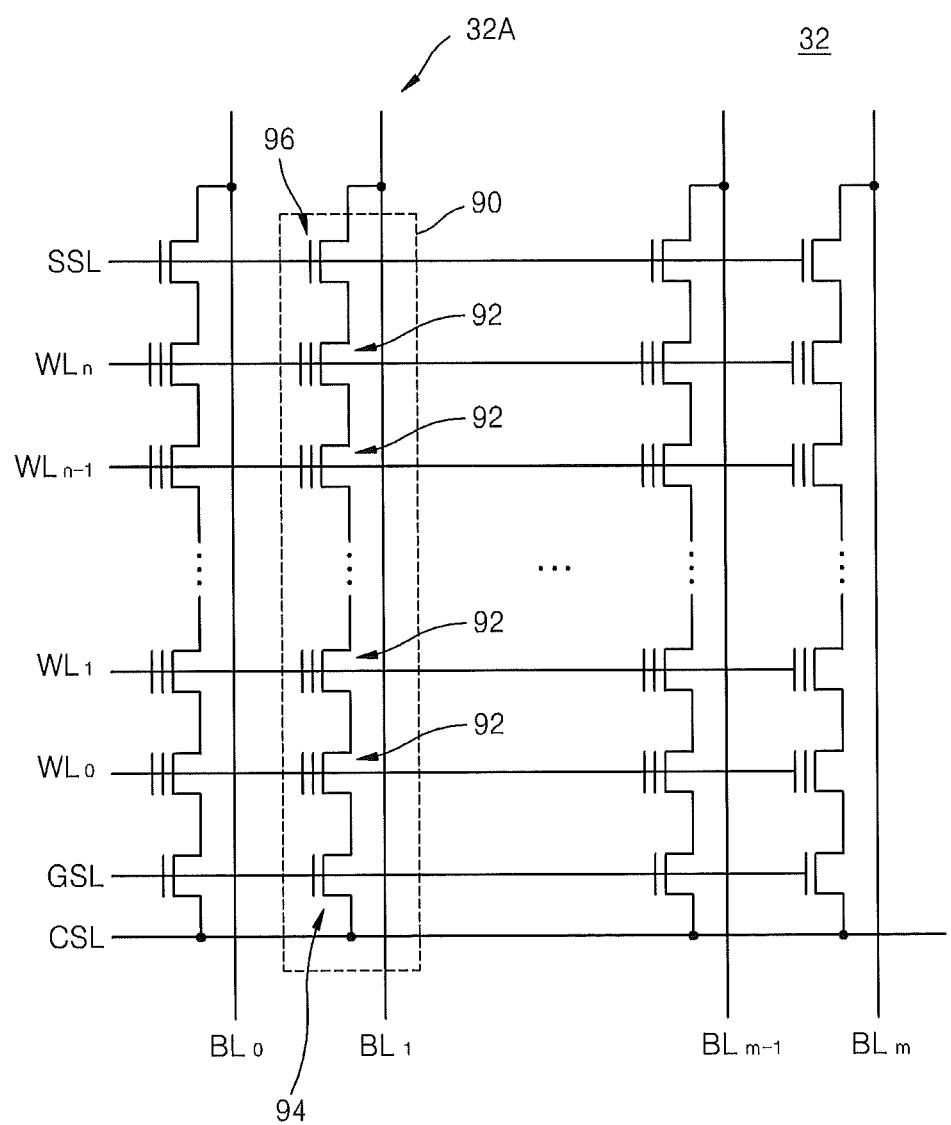
FIG. 2 is a circuit diagram for explaining the structure of a cell array of FIG. 1.

FIG. 2 is a circuit diagram for explaining an exemplary structure of the cell array 32 of FIG. 1. Referring to FIG. 2, the cell array 32 may include a plurality of memory cell blocks 32A including a plurality of memory cells 92. The memory cell blocks 32A each include a plurality of cell strings 90 formed between the bit line $BL_0, BL_1, \ldots BL_m$ and a common source line CSL. Each of the cell strings 90 includes the plurality of memory cells 92 connected in a serial manner. Gate electrodes of the memory cells 92 included in one of the cell strings 90 that is connected to a string selection line SSL are respectively connected to word lines $WL_0, WL_1, \ldots WL_n$. A ground selection transistor 94, which is connected to a ground selection line GSL, and a string selection transistor 96 are disposed on opposite ends of each of the cell strings 90. The ground selection transistor 94 and the string selection transistor 96 control the electrical connection between the memory cells 92 and the bit line $BL_0, BL_1, \ldots BL_n$ and the common source line CSL. The memory cells 92 each connected to word lines $WL_0, WL_1, \ldots WL_n$ across the cell strings 90 form a page unit or a bite unit.

In the word lines $WL_0, WL_1, \ldots WL_n$ of a conventional NAND flash memory device, a contact pad for connecting the word lines $WL_0, WL_1, \ldots WL_n$ to the decoder 34 is formed in one body with the word lines $WL_0, WL_1, \ldots WL_n$. In this way, it is necessary to form the contact pad connected to the word lines $WL_0, WL_1, \ldots WL_n$ together with the word lines $WL_0, WL_1, \ldots WL_n$. Also, in the case of a NAND flash memory device, relatively wider width and low density patterns such as a ground selection line GSL, a string selection line SSL, and a transistor for a peripheral circuit may be formed together with narrow width patterns such as word lines $WL_0, WL_1, \ldots WL_n$.

Figure 3:
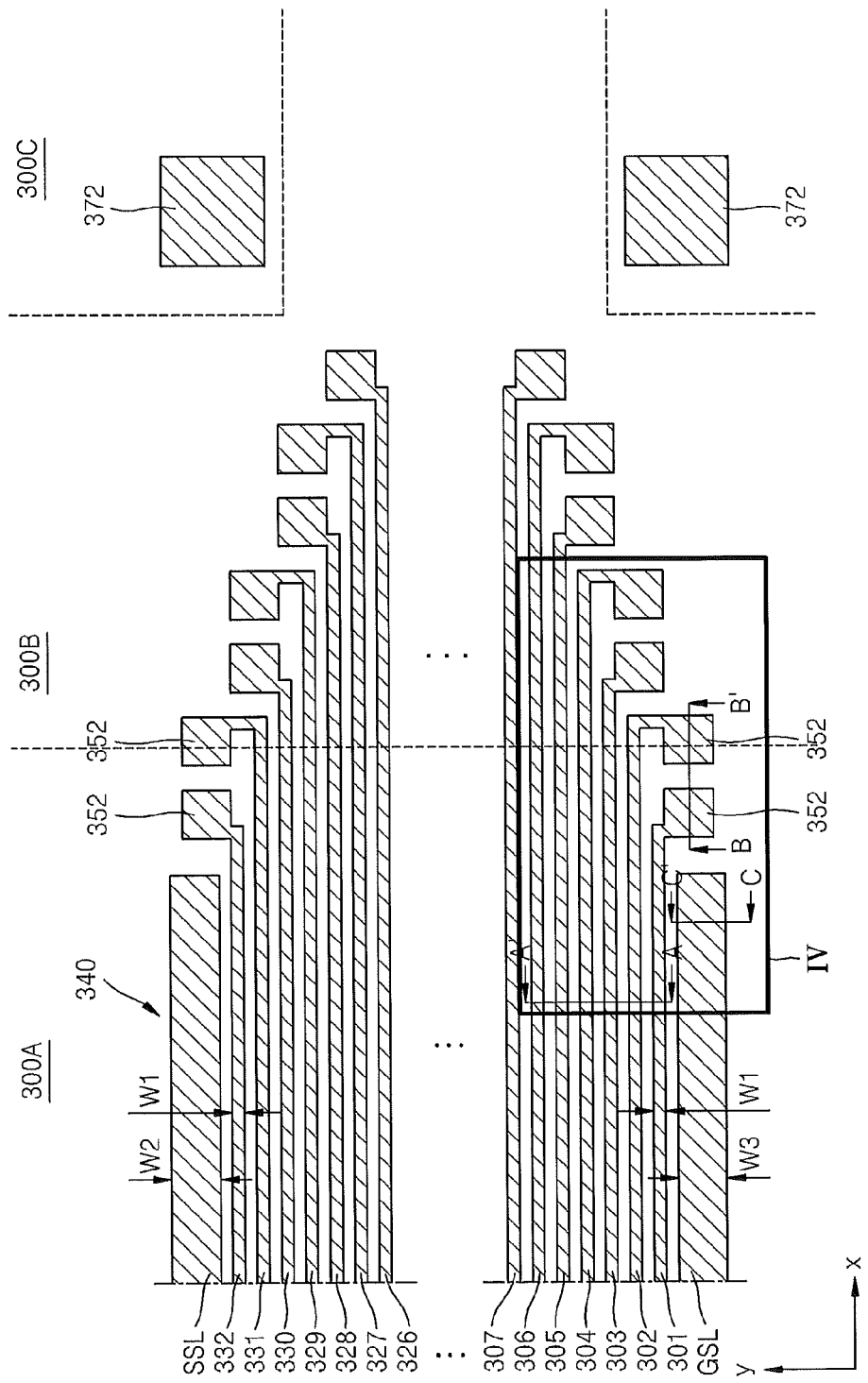
FIG. 3 is a plan view of a part of the configuration of a semiconductor device formed using a method of forming a micro-pattern according to an embodiment of the inventive concept.

FIG. 3 is a plan view of a part of the configuration of a semiconductor device formed using a method of forming a micro-pattern according to an embodiment of the inventive concept. FIG. 3 shows a portion of a memory cell region 300A of a NAND flash memory device, a plurality of conductive lines that constitute a cell array in the memory cell region 300A, for example, a portion of a connection region 300B for connecting word lines or bit lines to an external circuit (not shown) such as a decoder, and a portion of a peripheral circuit region 300c.

Referring to FIG. 3, the memory cell region 300A includes a plurality of memory cell blocks 340. In FIG. 3, only one memory cell block 340 is depicted for convenience of explanation. In the memory cell block 340, a plurality of conductive lines 301 through 332 that are required to form one cell string 90 (refer to FIG. 2) between a string selection line SSL and a ground selection line GSL extend parallel to one another in a first direction (in an x-direction in FIG. 3). Each of the conductive lines 301 through 332 extends across the memory cell region 300A and the connection region 300B.

In order to connect the conductive lines 301 through 332 to the external circuit (not shown) such as the decoder, a plurality of contact pads 352, formed as one-body with the conductive lines 301 through 332, are formed on one end of each of the conductive lines 301 through 332 in the connection region 300B.

In FIG. 3, in the connection region 300B, the end portions of the conductive lines 301 through 332 extend in a second direction (a y-direction in FIG. 3) which is perpendicular to the first direction. However, the current inventive concept is not limited to the concept of FIG. 3. Within the scope of the inventive concept, various modifications and changes to the configurations of the conductive lines 301 through 332 and the contact pads 352 are possible. Conductive patterns 372 for peripheral circuits are formed in the peripheral circuit region 300C.

In FIG. 3, all of the conductive lines 301 through 332, the string selection line SSL, the ground selection line GSL, the contact pads 352, and the conductive patterns 372 for peripheral circuits may be formed of an identical material. The conductive lines 301 through 332 respectively may be word lines that constitute a plurality of memory cells in the memory cell region 300A. The conductive patterns 372 for peripheral circuits may constitute gate electrodes of transistors for peripheral circuits. The string selection line SSL and the ground selection line GSL respectively may have widths greater than that of the conductive lines 301 through 332. As another example, the conductive lines 301 through 332 may be bit lines that constitute memory cells in the memory cell region 300A. In this case, the string selection line SSL and the ground selection line GSL may be omitted.

In FIG. 3, it is depicted that a plurality of conductive lines 301 through 332 includes 32 conductive lines in one memory cell block 340. However, the current inventive concept is not limited thereto, and one memory cell block 340 may include various numbers of conductive lines.

Next, a practical example of a method of forming a micro-pattern for semiconductor devices, according to an embodiment of the inventive concept, will now be described. FIGS. 4A, 4B through 14A, and 14B are plan views and cross-sectional views illustrating a process sequence of a method of forming a micro-pattern for semiconductor devices, according to an embodiment of the inventive concept. In particular, FIGS. 4A through 14A respectively are plan views of a rectangular portion "IV" in FIG. 3, and FIGS. 4B through 14B are cross-sectional views taken along lines A-A', B-B', and C-C' of the rectangular portion "IV" in FIG. 3.

Figure 4A:
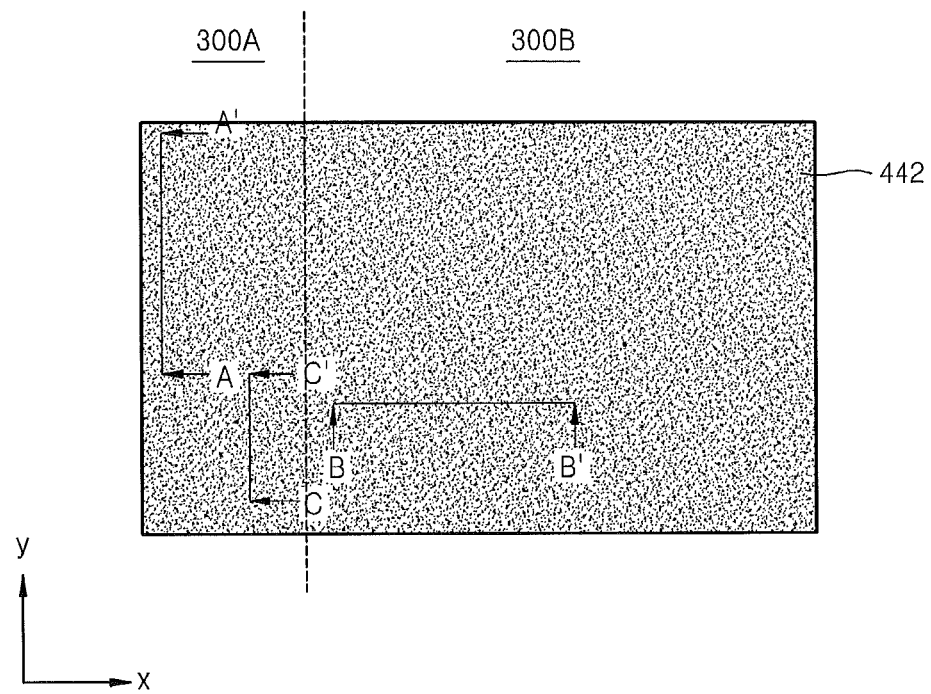
Figure 4B:
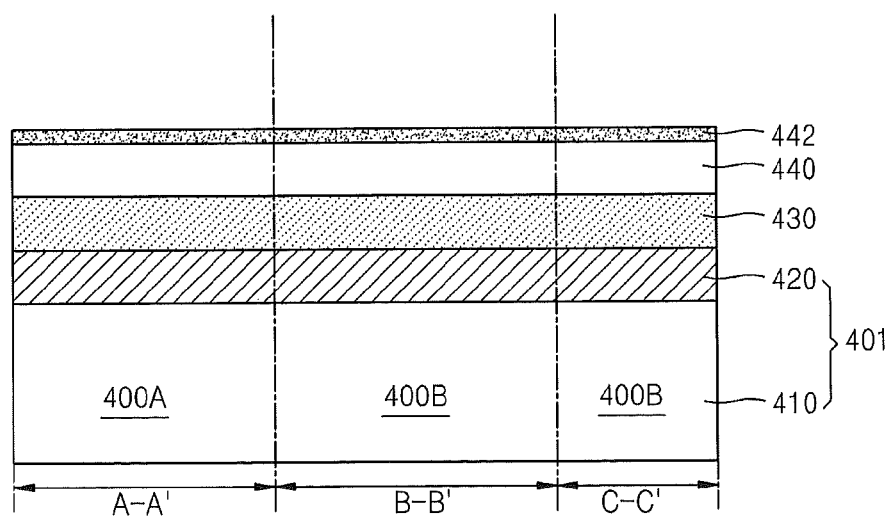

Referring to FIGS. 4A and 4B, a substrate 401 having a memory cell region 300A, a connection region 300B, and a peripheral circuit region 300C (refer to FIG. 3) is prepared. The substrate 401 may have a structure in which a target material film 420 is formed on a base substrate 410. The base substrate 410 may be a semiconductor substrate such as a silicon substrate, a silicon-on-insulator (SOI) substrate, a silicon-germanium substrate, a gallium-arsenic substrate. Also, the base substrate 410 may have a predetermined thin film or a structure on the semiconductors described above.

The target material film 420 is a film of a material to be eventually patterned, for example, a conductive metal, a metal nitride, a metal silicide, or a doped or undoped polysilicon. Also, the target material film 420 may be an oxide of silicon, a nitride of silicon, or an oxynitride of silicon. When word lines are formed from the target material film 420, the target material film 420 may include a conductive material selected from the group consisting of TaN, TiN, W, WN, HfN, WSi, and a combination of these materials. When bit lines are formed from the target material film 420, the target material film 420 may be formed of a doped polysilicon or a metal.

Next, a first hard mask material layer 430, a mold mask material film 440, and a anti-reflection film 442 may sequentially be formed on the substrate 401. If necessary, an additional hard mask material layer (not shown) may further be included between the first hard mask material layer 430 and the mold mask material film 440 or between the first hard mask material layer 430 and the substrate 401. The first hard mask material layer 430 may be formed of a material that has an etch selectivity with respect to materials adjacent to an upper or a lower side thereof, and is not specifically limited. The first hard mask material layer 430 may be, for example, a silicon nitride material layer. The first hard mask material layer 430 may have a thickness in a range from about 500 Å to about 3,000 Å.

The mold mask material film 440 may be, for example, a carbon-based film, in particular, a spin-on hardmask (SOH) or an amorphous carbon layer (ACL). For example, in order to form the mold mask material film 440, an organic compound layer is formed to a thickness in a range from about 1,000 Å to about 5,000 Å by spin coating. The organic compound may be formed of a hydrocarbon compound or a derivative thereof that includes an aromatic ring such as phenyl, benzene, or naphthalene. The organic compound may be formed of a material having relatively high carbon content in a range from about 85 wt % to about 99 wt % based on the total weight. The carbon-based film may be formed by primarily baking the organic compound layer at a temperature in a range from about 150° C. to about 350° C. for approximately 60 seconds. Afterwards, the carbon-based film is hardened by secondarily baking at a temperature in a range from about 300° C. to about 550° C. for approximately 30 to 300 seconds. In this way, when the carbon-based film is hardened through a second baking process, the carbon-based film is not adversely affected in a subsequent deposition process for forming another film on the carbon-based film although the deposition process is performed at a relatively high temperature of approximately 400° C. or above.

Figure 5A:
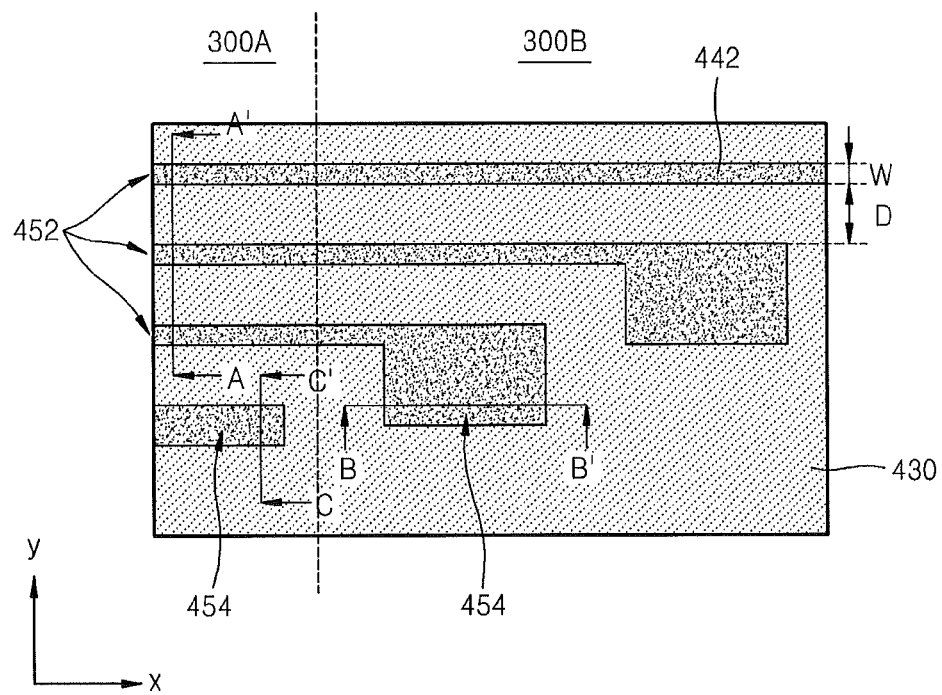
Figure 5B:
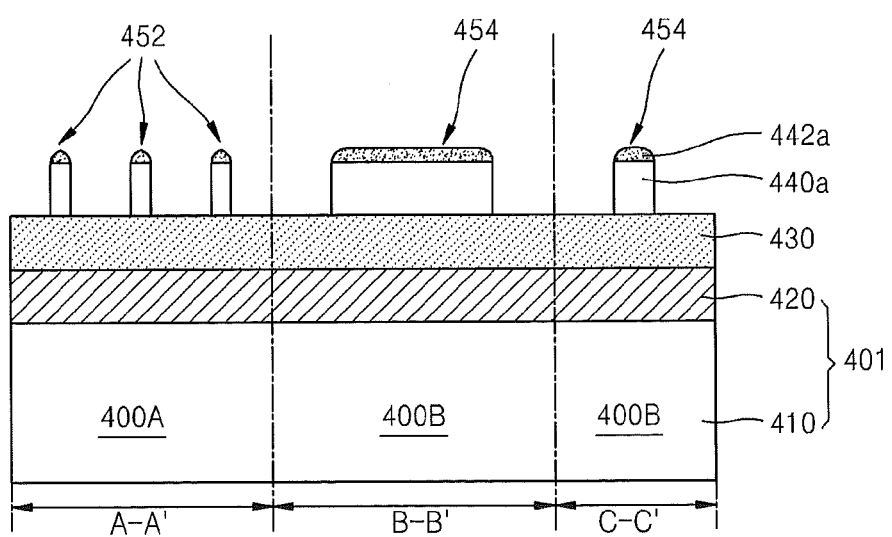

Referring to FIGS. 5A and 5B, narrow width mold mask patterns 452 are formed in a first region 400A and wide width mold mask patterns 454 are formed in a second region 400B of the substrate 401 from the mold mask material film 440. The narrow width mold mask patterns 452 and the wide width mold mask patterns 454 respectively may be formed in plural numbers.

In the first region 400A of the substrate 401, micro patterns having a narrow width may be formed by doubling the pattern density through a double patterning process in one of the memory cell region 300A and the connection region 300B. The first region 400A of the substrate 401 may correspond to a region where the conductive lines 301 through 332 shown in FIG. 3 are to be formed. The second region 400B of the substrate 401 may be a region where wide width patterns having a size or width larger than that in the first region 400A or patterns having a relatively low density are formed. For example, the first region 400A of the substrate 401 may be a region where the cell array 32 of FIG. 1 is formed, and the second region 400B may be a peripheral circuit region on which peripheral circuits for driving unit memory devices formed in the first region 400A, a core region, or a connection region.

Here, the wide width and the narrow width are relative concepts, and thus, have no practical numbers that can be a basis of division. The narrow width mold mask patterns 452 may have a first width W and may be arranged parallel to each other with a first distance D. The dimensions of the first width W and the first distance D are not specifically limited. For example, the first width W may be equal to the first distance D. Also, the first distance D may be three times larger than the first width W. Also, the first width W and the first distance D may be determined according to the size of one memory cell having a size determined by a design rule. The first width W and the first distance D respectively may have a 1F through a 3F size. Here, F denotes the minimum feature size in a memory cell. The wide width mold mask patterns 454 may have a size or a width greater than that of the narrow width mold mask patterns 452.

The narrow width mold mask patterns 452 and the wide width mold mask patterns 454 may be formed by using a photolithography process. That is, a photoresist pattern may be formed on the anti-reflection film 442 by exposing and developing a photoresist film (not shown) using an exposure mask after forming the photoresist film on the anti-reflection film 442. Afterwards, the narrow width mold mask patterns 452 and the wide width mold mask patterns 454 may be obtained by anisotropically etching the mold mask material film 440 and the anti-reflection film 442 using the photoresist pattern as an etch mask. Next, the photoresist pattern remaining on upper parts of the narrow width mold mask patterns 452 and the wide width mold mask patterns 454 may be readily removed by, for example, an ashing method.

As can be seen from FIG. 5A, the narrow width mold mask patterns 452 and the wide width mold mask patterns 454 may be formed in one-body by being connected to each other. However, all of the wide width mold mask patterns 454 may not be connected to the narrow width mold mask patterns 452, and some wide width mold mask patterns 454 may not be connected to the narrow width mold mask patterns 452. For example, as shown in FIG. 3, in the cases for forming the string selection line SSL and/or the ground selection line GSL in the memory cell region 300A, or for forming the conductive patterns 372 for peripheral circuits in the peripheral circuit region 300C, the wide width mold mask patterns 454 may not be connected to the narrow width mold mask patterns 452.

Figure 6A:
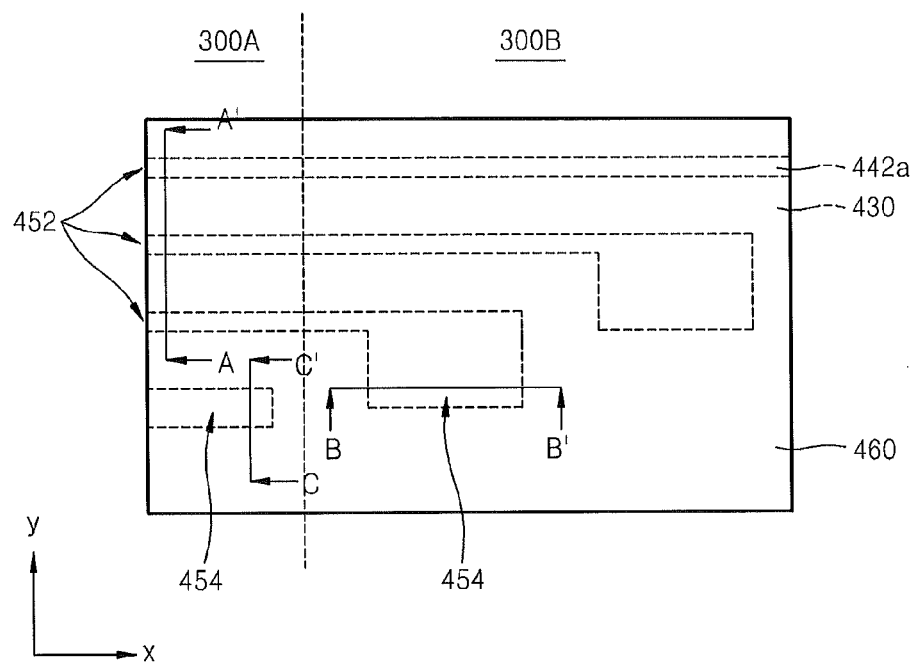
Figure 6B:
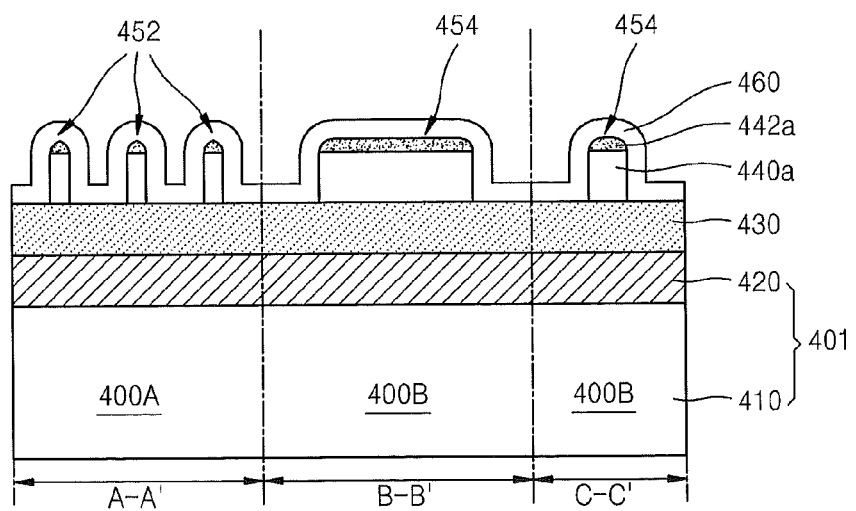

Referring to FIGS. 6A and 6B, a spacer mask layer 460 having a substantially uniform thickness is formed on side walls and upper parts of the narrow width mold mask patterns 452 and the wide width mold mask patterns 454. The spacer mask layer 460 also covers an exposed surface of the first hard mask material layer 430 with a substantially uniform thickness. The spacer mask layer 460 may have an etch selectivity with respect to the narrow width mold mask patterns 452, the wide width mold mask patterns 454, and the first hard mask material layer 430. The spacer mask layer 460 may be, for example, a silicon oxide film. In order to form the spacer mask layer 460 having a uniform thickness, the spacer mask layer 460 may be formed by using an atomic layer deposition (ALD) or chemical vapour deposition (CVD). However, the method is not limited thereto.

Figure 7A:
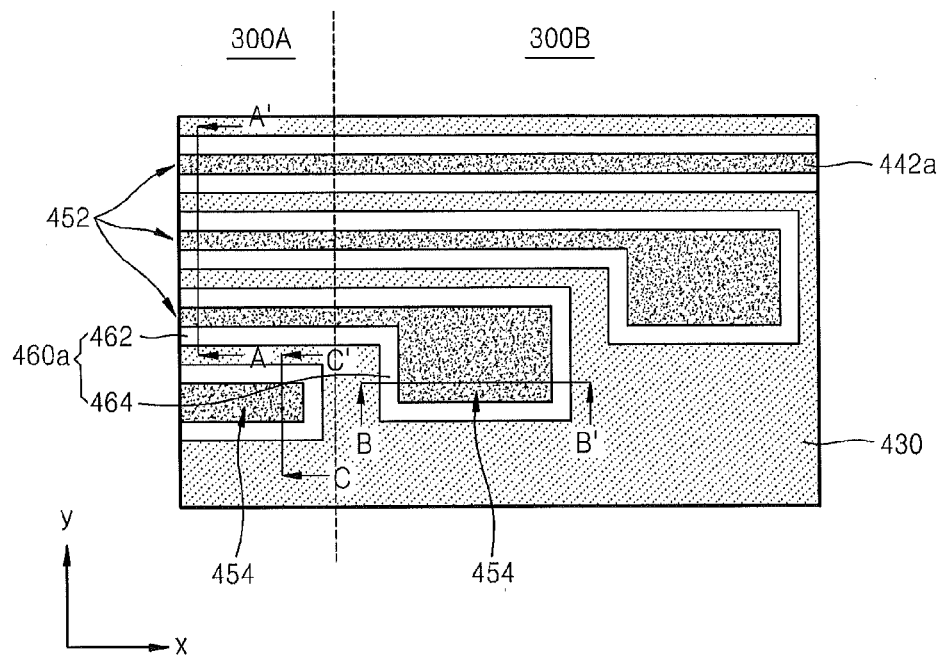
Figure 7B:
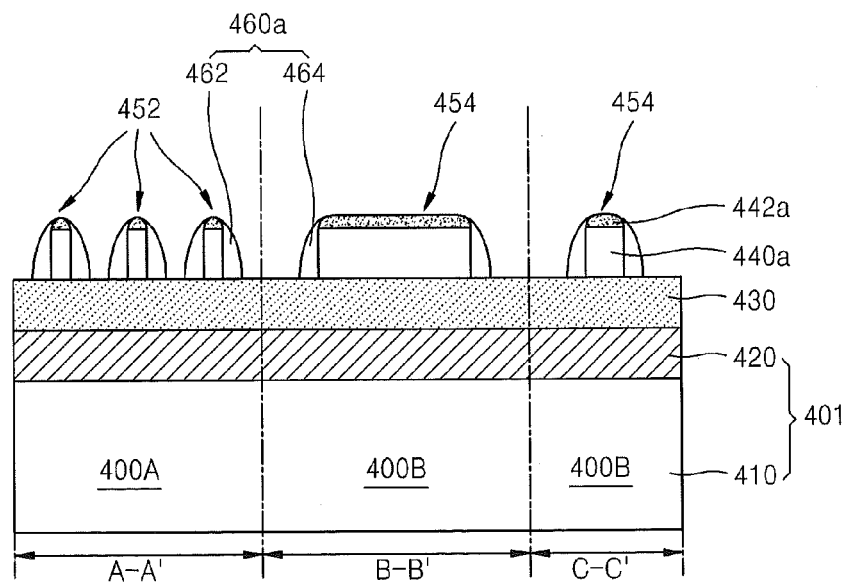

Referring to FIGS. 7A and 7B, a first spacer 462 and a second spacer 464 respectively are formed on side walls of the narrow width mold mask patterns 452 and the wide width mold mask patterns 454 by anisotropically etching the spacer mask layer 460. As shown in FIG. 7A, the first spacer 462 and the second spacer 464 may be connected to each other to form a loop shape spacer 460a. In order to form the first spacer 462 and the second spacer 464, the anisotropical etching of the spacer mask layer 460 may be performed until the surface of the first hard mask material layer 430 is exposed. In FIGS. 7A and 7B, it is depicted that the anti-reflection film 442a remains. However, in some cases, the anti-reflection film 442a may be removed when the spacer mask layer 460 is anisotropically etched.

Figure 8A:
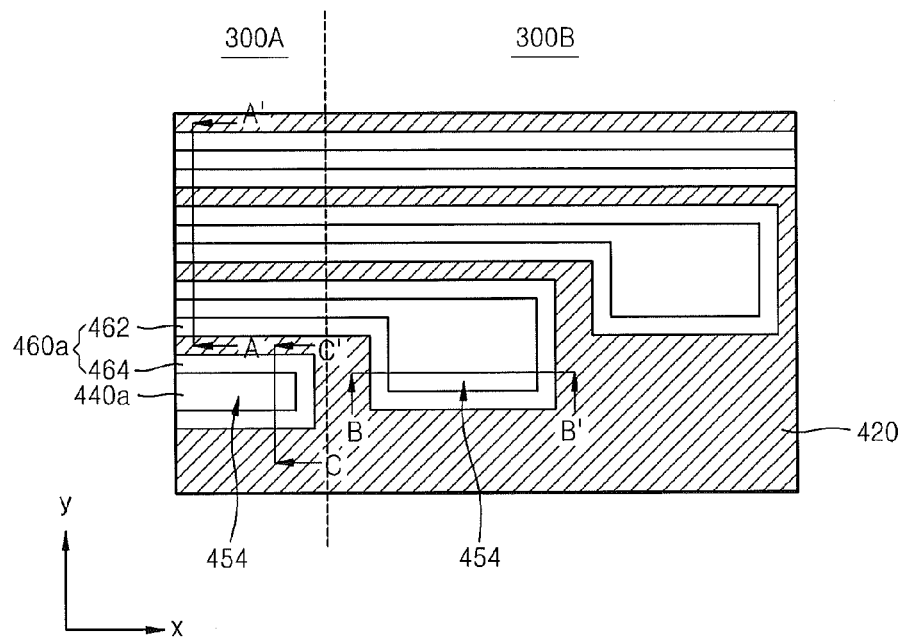
Figure 8B:
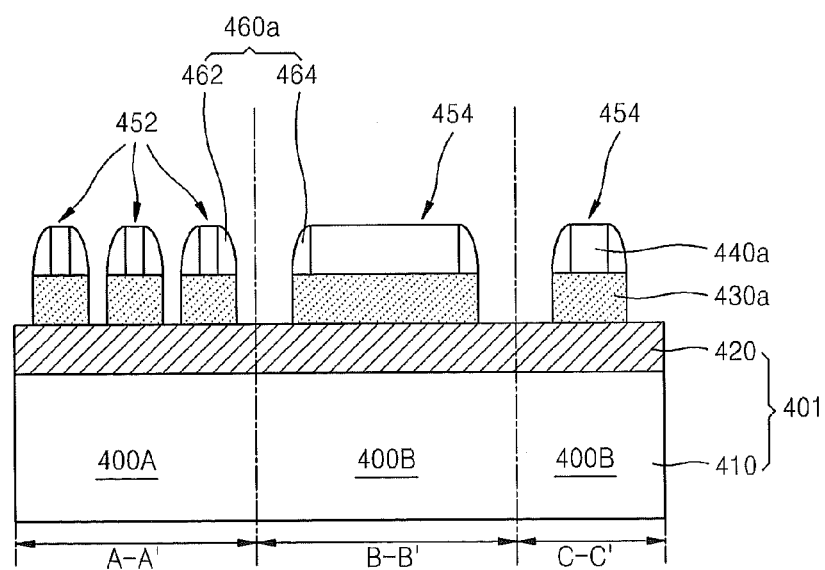

Referring to FIGS. 8A and 8B, the first hard mask material layer 430 is anisotropically etched using the first spacer 462, the second spacer 464, the narrow width mold mask patterns 452, and the wide width mold mask patterns 454 as etch masks. Through the anisotropical etching, a patterned first hard mask 430a may be obtained. At this point, any remaining anti-reflection film 442a may also be removed.

As a result, the target material film 420 may be exposed. As described above, if there is an additional hard mask material film besides the first hard mask material layer 430, the target material film 420 may be exposed by performing an additional anisotropical etching using the hard mask material film obtained by the anisotropical etching as shown in FIGS. 8A and 8B.

Figure 9A:
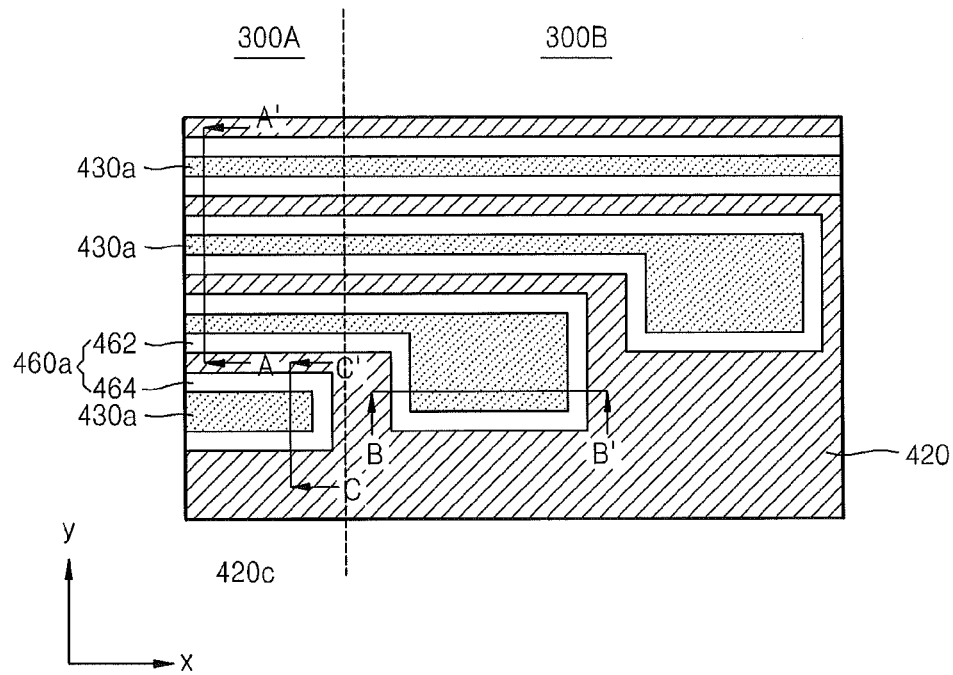
Figure 9B:
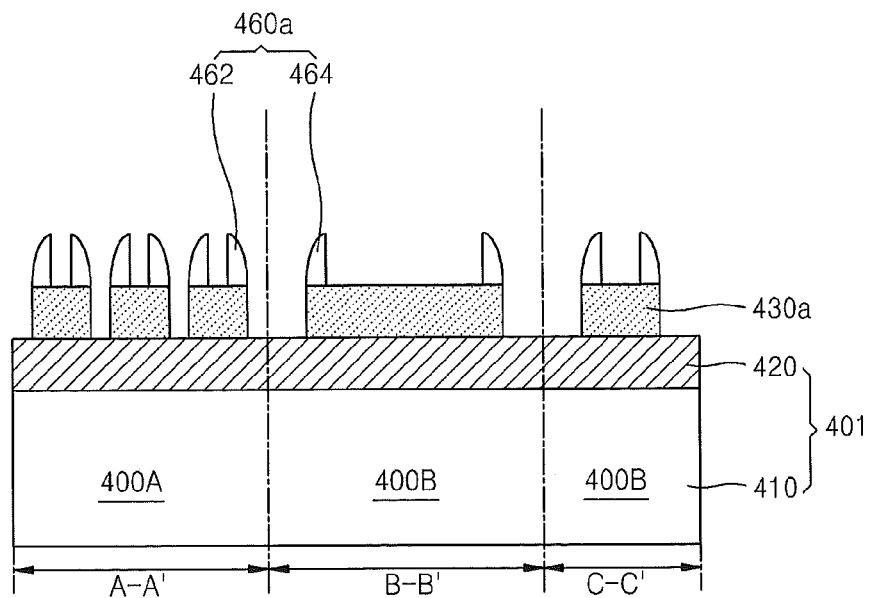

Referring to FIGS. 9A and 9B, the narrow width mold mask patterns 452 and the wide width mold mask patterns 454 are removed from the first region 400A and the second region 400B of the substrate 401 under a condition that the first spacer 462, the second spacer 464, the first hard mask 430a, and the target material film 420 are prevented from being etched. If the narrow width mold mask patterns 452 and the wide width mold mask patterns 454 are formed of a carbon-based material, they can be readily removed by, for example, an aching method.

As a result, a loop shape spacer 460a remains on the first hard mask 430a. In the first region 400A, the first hard mask 430a between the first spacers 462 will be removed; however, in the second region 400B, the first hard mask 430a between the second spacers 464 will not be removed. Accordingly, in the second region 400B, it is necessary to form a blocking material film for protecting the first hard mask 430a between the second spacers 464 from being removed while the first hard mask 430a between the first spacers 462 in the first region 400A is removed.

Figure 10A:
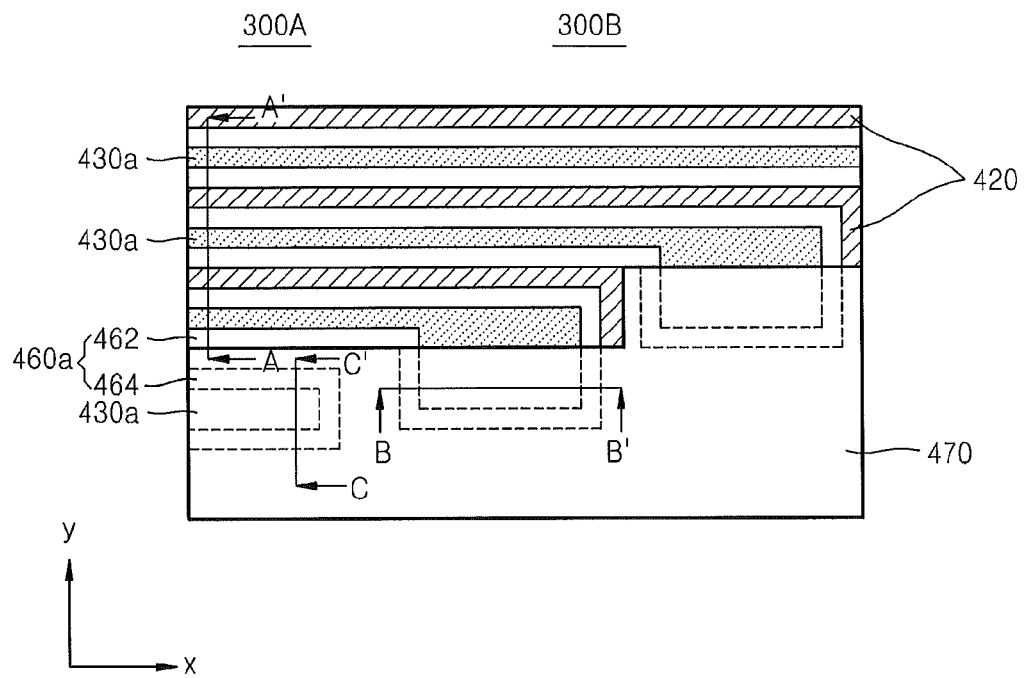
Figure 10B:
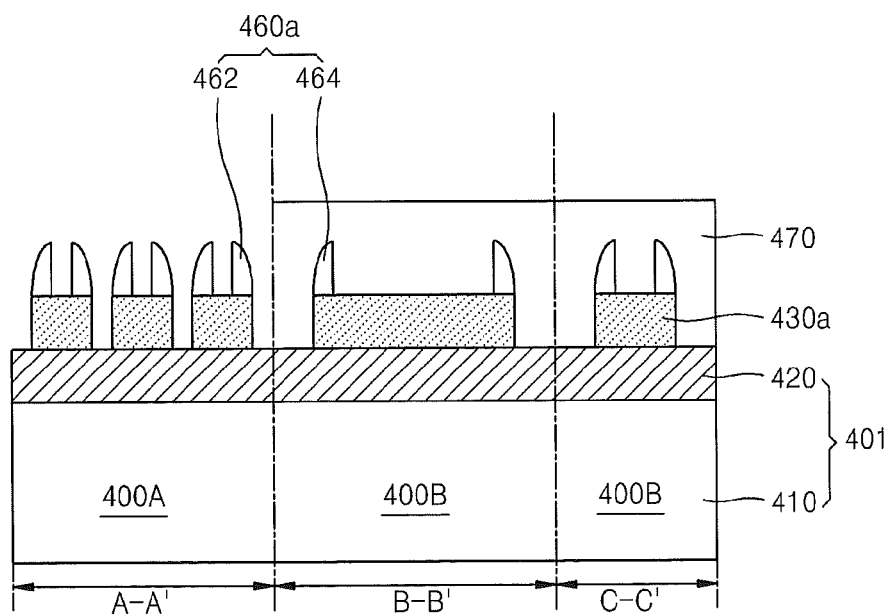

Referring to FIGS. 10A and 10B, as described above, a blocking material film 470 is formed in the second region 400B. The blocking material film 470 may be formed of any material that has an etch selectivity with respect to the first hard mask 430a. The blocking material film 470 may be, for example, a photoresist.

Figure 10C:
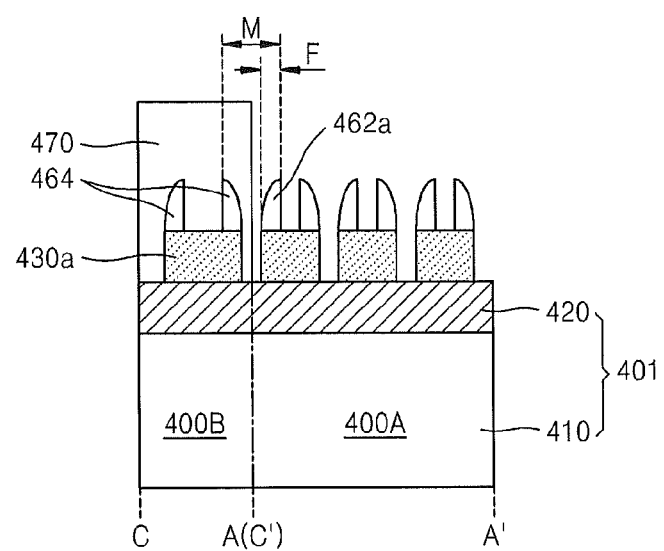
FIG. 10C is a lateral cross-sectional view showing a misalignment margin that may occur when the blocking material film of FIGS. 10A-10B is formed.

FIG. 10C is a lateral cross-sectional view showing a misalignment margin when the blocking material film 470 is formed, and consecutively shows the cross-sections of C-C' and A-A'. Referring to FIG. 10C, an ideal point of a right side boundary of the blocking material film 470 may be the middle point between the first hard mask 430a of the second region 400B and a first spacer 462a that is most adjacent to the second region 400B. However, as long as the right-hand side boundary of the blocking material film 470 lies within the range of M shown in FIG. 10C, the purpose of protecting the first hard mask 430a between the second spacers 464 from being removed may be achieved. Accordingly, when it is assumed that all of widths between the spacers and distances between the spacers are F, M is 3Fs. Thus, the forming of the blocking material film 470 has a misalignment margin of 3F, in other words, a misalignment margin of ±1.5F.

Referring to FIG. 10A again, although the purpose of the blocking material film 470 is basically to protect the first hard mask 430a between the second spacers 464 in the second region 400B, portions of the first hard mask 430a that may be unnecessary in a subsequent process may be removed and may be exposed from the blocking material film 470.

If the blocking material film 470 is a photoresist material film, the blocking material film 470 may be readily formed by performing a photolithography process after coating a photoresist on an entire surface of the resultant product. As described above, the formation of the blocking material film 470 may have a misalignment margin of 3F, and a micro-pattern having a resolution finer than the resolution limitation of the photolithography process may be formed.

Figure 11A:
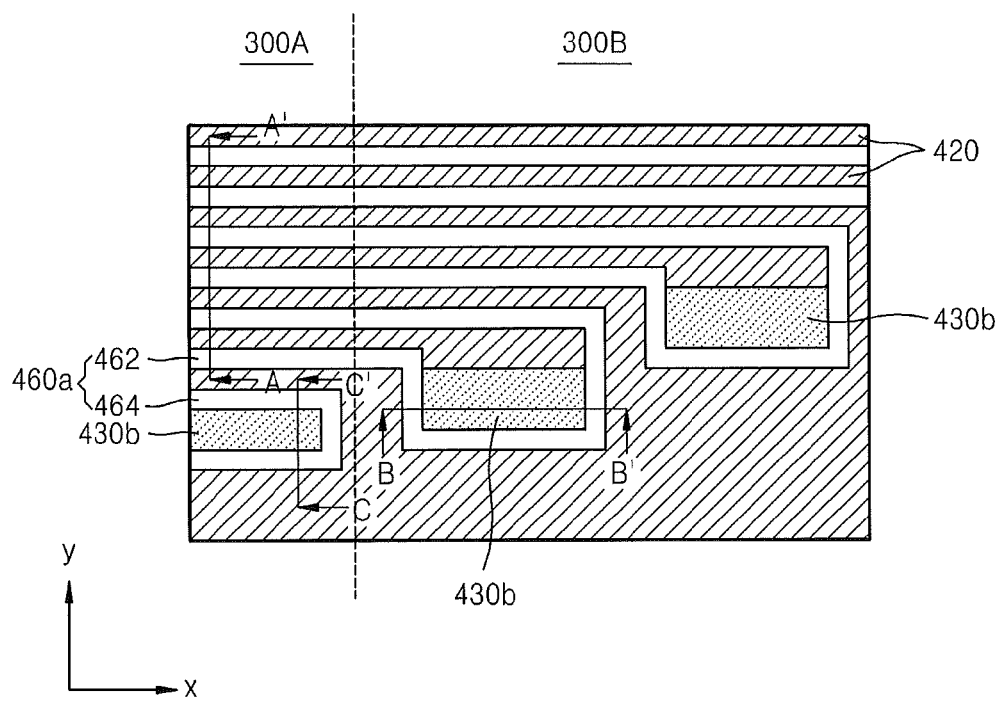
Figure 11B:
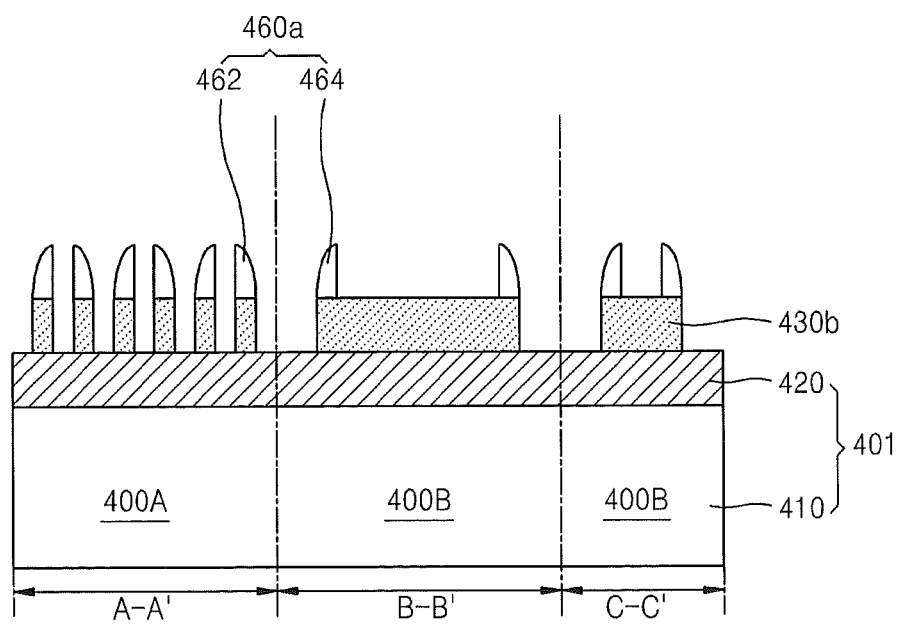

Referring to FIGS. 11A and 11B, the exposed first hard mask 430a is anisotropically etched using the blocking material film 470, the first spacer 462, and the second spacer 464 as etch masks. As a result, the first hard mask 430a located between the first spacers 462 may be removed. In particular, a portion of the first hard mask 430a located below the narrow width mold mask patterns 452 may be removed. As a result, a new second hard mask 430b is obtained.

As described above, the first spacer 462 and the second spacer 464 are connected to each other, and thus, form a loop shape spacer 460a. In this case, it is necessary to separate the first spacer 462 and the second spacer 464 from each other to form individual patterns.

Figure 12A:
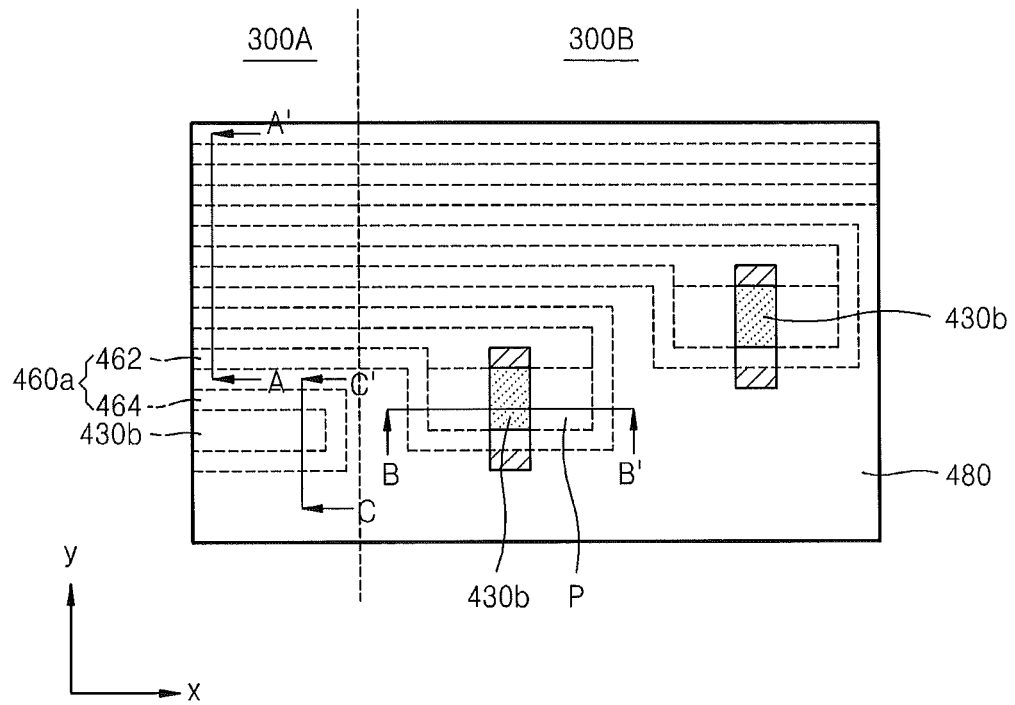
Figure 12B:
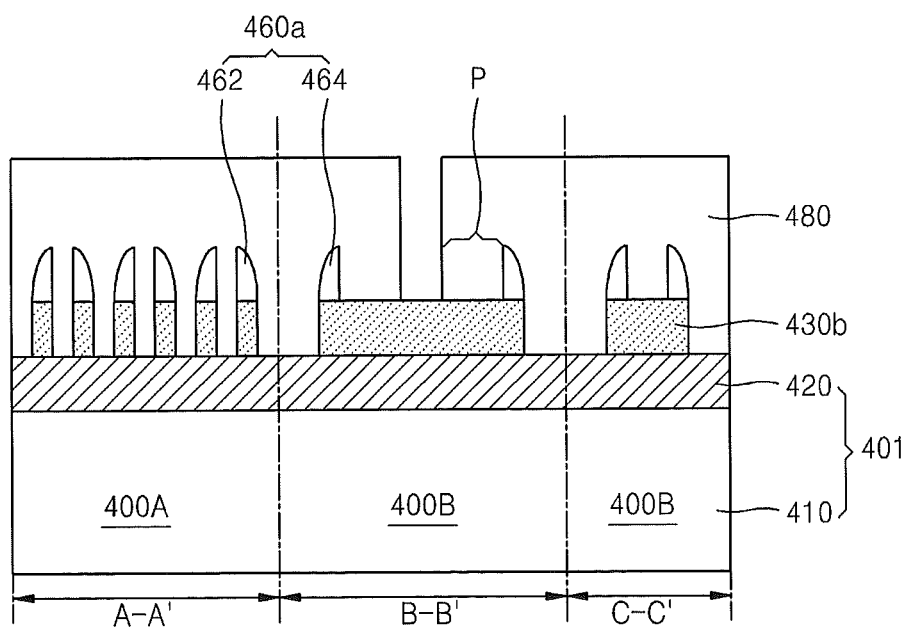

Referring to FIGS. 12A and 12B, a separation etch mask 480 that exposes portions of the loop shape spacer 460a to be removed for separating the loop shape spacer 460a is formed. The separation etch mask 480 may be, for example, a photoresist. FIG. 12A shows a case of separating the loop shape spacer 460a by removing a portion of the second spacer 464 and a portion of the second hard mask 430b. Although not directly shown in FIG. 12A, in order to separate the loop shape spacer 460a into two parts, another portion of the loop shape spacer 460a may further be exposed. Also, referring to FIG. 12A, there is a portion P in which the second hard mask 430b is not exposed by the separation etch mask 480 and not covered by the loop shape spacer 460a. This portion P may be transferred to the target material film 420 in a subsequent process to be used as a connection pad for forming a contact.

Figure 13A:
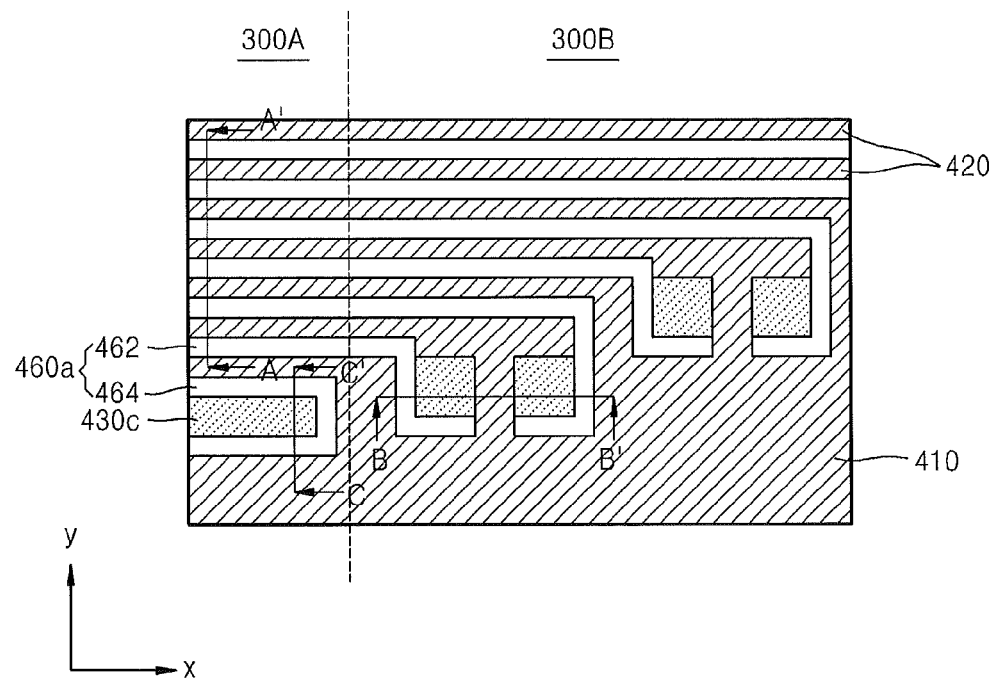
Figure 13B:
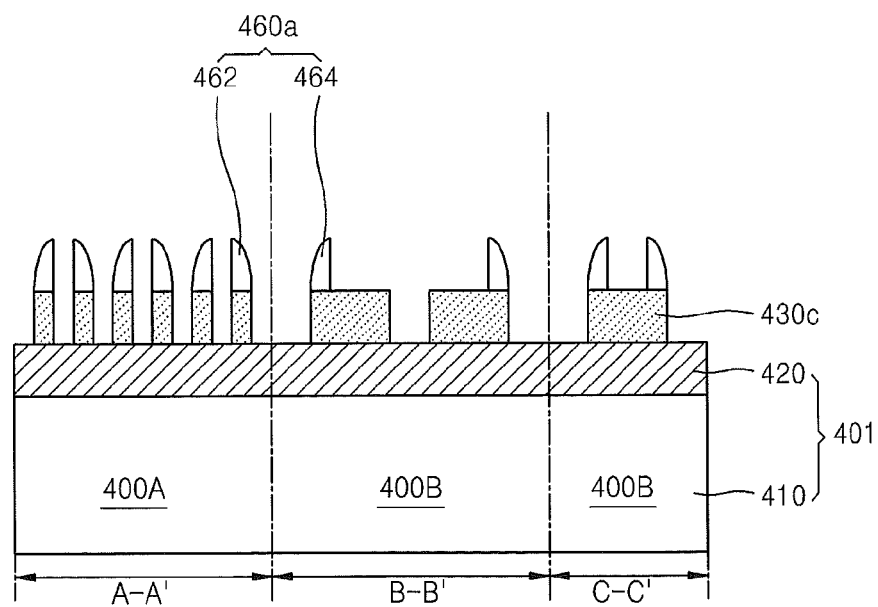

Referring to FIGS. 13A and 13B, the exposed portion of the loop shape spacer 460a and the exposed portion of the second hard mask 430b are removed by etching using the separation etch mask 480. Through the etching, one loop shape spacer 460a can be divided into two parts. Also, a portion of the second hard mask 430b is separated, and thus, a new third hard mask 430c is formed. Next, the separation etch mask 480 may be removed.

Figure 14A:
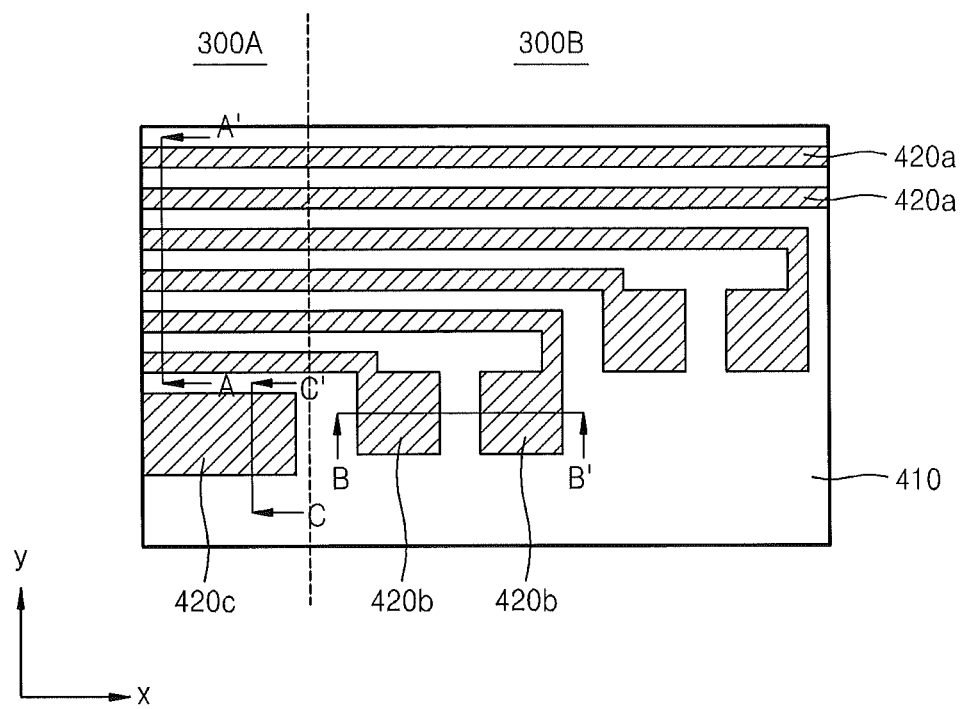
Figure 14B:
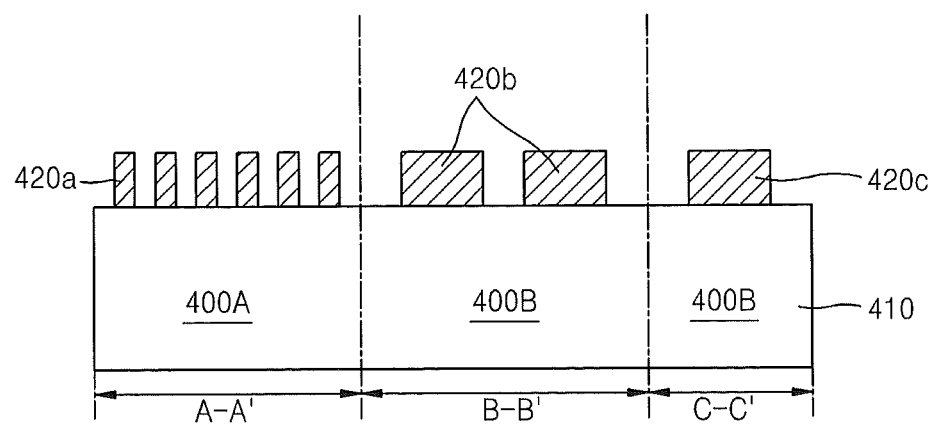

Referring to FIGS. 14A and 14B, the target material film 420 is etched using the first spacer 462, the second spacer 464, and the third hard mask 430c as etch masks. In the first region 400A, a first pattern 420a to which the width and the pitch of the first spacer 462 are transferred is formed, and, in the second region 400B, a second pattern 420b and a third pattern 420c to which the width and the pitch of the third hard mask 430c are transferred are formed. The second pattern 420b may be formed in one body with the first pattern 420a. In the first region 400A, the pattern density of the narrow width mold mask pattern 452 is doubled to form the first spacer 462, and the pattern of the first spacer 462 is, in turn, transferred to form the second hard mask 430b and the first pattern 420a in a narrow width. In the second region 400B, the width of the pattern of the third hard mask 430c formed from the wide width mold mask patterns 454 is transferred to the second pattern 420b and the third pattern 420c.

The first pattern 420a may correspond to the plurality of conductive lines 301 through 332 in the memory cell region 300A shown in FIG. 3, and the second pattern 420b may correspond to the plurality of contact pads 352 respectively formed in one-body with the conductive lines 301 through 332 in the connection region 300B shown in FIG. 3. Also, the third pattern 420c may correspond to the string selection line SSL and the ground selection line GSL in the memory cell region 300A shown in FIG. 3.

If the target material film 420 is formed of a conductive material, a conductive pattern may be obtained. However, alternatively, if the target material film 420 is a hard mask material film, a new hard mask pattern may be obtained, and a film below the hard mask pattern may be additionally etched using the new hard mask pattern. For example, in order to define an active region on the base substrate 410, a method described with reference to FIGS. 4A, 4B through 14A, and 14B may be used. Those skilled in the art may define an active region by forming a plurality of trenches having various widths in a semiconductor substrate and by burying an insulating material in the trenches using the method described with reference to FIGS. 4A, 4B through 14A, and 14B.

Also, as described above, the first pattern 420a, the second pattern 420b, and the third pattern 420c may be obtained by a single etching process. That is, an etching process required for forming the conductive lines 301 through 332 that constitute the memory cell region 300A and an etching process for forming relatively large patterns such as the plurality of contact pads 352 for connecting peripheral circuits, the string selection line SSL and the ground selection line GSL formed in the memory cell region 300A, and conductive patterns 372 for peripheral circuits formed in the peripheral circuit region 300C are not separately performed, but are simultaneously performed. In this case, a misaligning problem that can occur between the etching processes may be basically removed.

In addition, since the first pattern 420a, the second pattern 420b, and the third pattern 420c are simultaneously obtained by a single photolithography process, a material having identical or similar etching characteristics may be used as an etch mask. Accordingly, different etching characteristics according to the material used to form the etch mask and the possibility of degradation of pattern uniformity may be removed.

Also, when a narrow width pattern is formed adjacent to a wide width pattern, there is no height difference of surfaces of mold mask patterns for forming the narrow and wide width patterns, thereby remarkably reducing the cause of pattern failure.

DETAILED DESCRIPTION

Thus, as described hereinabove with respect to FIGS. 4A-14A and 4B-14B, a target material layer 420 is formed on a substrate 410 and first and second mask layers (430, 440) of different material are formed in sequence on the target material layer 420. (See, e.g., FIG. 4B). The second mask layer 440 is selectively etched to define a first pattern therein, as illustrated by FIG. 5B. (See, e.g., 452, 454). Sidewall spacers (462, 464) are formed on opposing sidewalls of the first pattern, as illustrated by FIGS. 6B-7B. The first pattern and sidewall spacers are then used collectively as an etching mask during a step to selectively etch the first mask layer 430 to define a second pattern (430a) therein, as illustrated by FIG. 8B. The first pattern is then removed to define an opening between the sidewall spacers, as illustrated by FIG. 9B. The first mask layer is then selectively re-etched to convert the second pattern into at least a third pattern, using the sidewall spacers as an etching mask, as illustrated by FIGS. 10B-11B. Thereafter, the target material layer 420 is selectively etched using the third pattern as an etching mask, as illustrated by FIGS. 13B-14B.

Additional embodiments of the invention include methods of forming integrated circuit memory devices. According to some of these embodiments of the invention, an electrically conductive target material layer 420 is formed on a substrate and first and second mask layers (430, 440) of different material are formed on the target material layer 420. The second mask layer 440 is selectively etched to define a first pattern (452, 454) therein and then sidewall spacers 462, 464 are formed on opposing sidewalls of the first pattern, as illustrated by FIGS. 6B-7B. This first pattern and the sidewall spacers are then used collectively as an etching masked during a step of selectively etching the first mask layer 430 to define a second pattern 430a therein, as illustrated by FIG. 8B. Then, as illustrated by FIG. 9B, the first pattern is removed to thereby define an opening between the sidewall spacers. A first portion of the second pattern is then covered with a protective third mask layer 470 prior to a step of selectively re-etching the first mask layer to convert a second portion of the second pattern 430a into at least a third pattern 430b, using the sidewall spacers 462 (and third mask layer 470) as an etching mask. (See, e.g., FIGS. 10B-11B). This third pattern is then covered with a protective fourth mask layer 480 before selectively etching the first portion of the second pattern to thereby define a fourth pattern 430c, as shown by FIG. 13B. Thereafter, the target material layer is selectively etched using the third pattern as an etching mask to define a plurality of word lines 420a of the memory device and also using the fourth pattern as an etching mask to define a plurality of contact pads 420b that are electrically connected to the plurality of word lines 420a, as illustrated by FIG. 14B.

While the inventive concept has been particularly shown and described with reference to exemplary embodiments thereof, it will be understood that various changes in form and details may be made therein without departing from the spirit and scope of the following claims.

The invention claimed is:

1. A method of forming an integrated circuit device, comprising:

forming a target material layer on a substrate;

forming a first mask layer on the target material layer and
   a second mask layer on the first mask layer;
selectively etching the second mask layer to define a first
   pattern therein;
forming sidewall spacers on opposing sidewalls of the first
   pattern;
selectively etching the first mask layer to define a second
   pattern therein, using the first pattern and the sidewall
   spacers as an etching mask;
selectively removing the first pattern to define an opening
   between the sidewall spacers;
selectively etching the first mask layer to convert the second pattern into at least a third pattern, using the sidewall
   spacers as an etching mask; and
selectively etching the target material layer using the third
   pattern as an etching mask.

2. The method of claim 1, wherein said forming sidewall spacers comprises depositing a silicon oxide layer on the first pattern using an atomic layer deposition or chemical vapor deposition technique and then etching back the deposited silicon oxide layer to define the sidewall spacers.

3. The method of claim 1, wherein said selectively etching the second mask layer is preceded by depositing an antireflective film on the second mask layer.

4. The method of claim 1, wherein the first mask layer is a silicon nitride layer having a thickness in a range from about 500 angstroms to about 3000 angstroms.

5. The method of claim 1, wherein the second mask layer is an organic material layer having a thickness in a range from about 1000 angstroms to about 5000 angstroms.

6. The method of claim 1, wherein said forming a target material layer comprises depositing an electrically conductive layer on the substrate, said electrically conductive layer selected from the group consisting of metals, metal nitrides, metal silicides and doped or undoped polysilicon.

7. The method of claim 1, wherein said forming a target material layer comprises depositing an electrically conductive layer on the substrate, said electrically conductive layer selected from the group consisting of tantalum nitride, titanium nitride, tungsten, tungsten nitride, hafnium nitride and tungsten silicide.

8. The method of claim 1, wherein said forming a target material layer comprises depositing an electrically insulating layer on the substrate.

9. A method of forming a micro-pattern of semiconductor devices, the method comprising:
   providing a substrate that comprises a first region on which a narrow width pattern is to be formed and a second region on which a wide width pattern is to be formed;
   forming a first hard mask material film on the substrate;
   forming a narrow width mold mask pattern in the first region;
   forming a wide width mold mask pattern in the second region;
   forming a first spacer on side walls of the narrow width mold mask pattern;
   forming a second spacer on side walls of the wide width mold mask pattern;
   etching the first hard mask material film using the narrow width mold mask pattern, the wide width mold mask pattern, the first spacer, and the second spacer as etch masks;
   removing the narrow width mold mask pattern; and
   etching the first hard mask material film exposed by the removal of the narrow width mold mask pattern using the first spacer as an etch mask.

10. The method of claim 9, wherein the narrow width mold mask pattern has an upper surface with substantially the same height as that of the wide width mold mask pattern.

11. The method of claim 9, wherein the operation of forming the narrow width mold mask pattern in the first region and the operation of forming the wide width mold mask pattern in the second region are performed in a single process.

12. The method of claim 9, further comprising removing the wide width mold mask pattern.

13. The method of claim 12, further comprising forming a blocking material film that exposes the first region.

14. The method of claim 9, wherein a portion of the wide width mold mask pattern is formed in a single body with the narrow width mold mask pattern to be connected to each other.

15. The method of claim 14, wherein another portion of the wide width mold mask pattern is formed only in the second region so as not to be connected to the narrow width mold mask pattern.

16. The method of claim 9, wherein the first spacer and the second spacer are connected to each other to form a loop shape spacer.

17. The method of claim 16, further comprising removing a portion of the first spacer and a portion of the second spacer to separate the loop shape spacer into two spacers.

18. The method of claim 9, wherein the substrate comprises a memory cell region, a peripheral circuit region, and a connection region located between the memory cell region and the peripheral circuit region, wherein the first region is included in the memory cell region and the second region is included in the connection region.

19. The method of claim 18, wherein the narrow width mold mask pattern extends from the memory cell region to the connection region, and the wide width mold mask pattern is formed in the memory cell region, the peripheral circuit region, and the connection region respectively.

20. A method of forming an integrated circuit memory device, comprising:
   forming a target material layer on a substrate;
   forming a first mask layer on the target material layer and a second mask layer on the first mask layer;
   selectively etching the second mask layer to define a first pattern therein;
   forming sidewall spacers on opposing sidewalls of the first pattern;
   selectively etching the first mask layer to define a second pattern therein, using the first pattern and the sidewall spacers as an etching mask;
   selectively removing the first pattern to define an opening between the sidewall spacers;
   covering a first portion of the second pattern with a third mask layer;
   selectively reetching the first mask layer to convert a second portion of the second pattern into at least a third pattern, using the sidewall spacers as an etching mask;
   covering the third pattern with a fourth mask layer;
   selectively etching the first portion of the second pattern to thereby define a fourth pattern; and
   selectively etching the target material layer using the third pattern as an etching mask to define a plurality of word lines of the memory device and the fourth pattern as an etching mask to define a plurality of contact pads that are electrically connected to the plurality of word lines.

21. The method of claim 20, wherein the first mask layer is a silicon nitride layer having a thickness in a range from about 500 angstroms to about 3000 angstroms.

22. The method of claim 21, wherein the second mask layer is an organic material layer having a thickness in a range from about 1000 angstroms to about 5000 angstroms.

* * * * *